(12) United States Patent
Hsieh

(10) Patent No.: US 8,698,712 B2
(45) Date of Patent: Apr. 15, 2014

(54) PIXEL STRUCTURE OF ACTIVE MATRIX ORGANIC ELECTROLUMINESCENT DISPLAY PANEL AND METHOD OF MAKING THE SAME

(75) Inventor: Hsing-Hung Hsieh, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 377 days.

(21) Appl. No.: 13/048,903

(22) Filed: Mar. 16, 2011

(65) Prior Publication Data
US 2012/0162271 A1   Jun. 28, 2012

(30) Foreign Application Priority Data

Dec. 24, 2010   (TW) ................................ 99145747 A (51) Int. Cl.
*G09G 3/30*   (2006.01)
(52) U.S. Cl.
USPC .............................................. 345/80; 345/76
(58) Field of Classification Search
USPC ............................... 345/76–83; 257/43, 59, 72
See application file for complete search history.

(56) References Cited

U.S. PATENT DOCUMENTS

| | | |
|---|---|---|
| 7,507,993 B2 | 3/2009 | Lee |
| 2004/0227159 A1 | 11/2004 | Nakashima |
| 2004/0245531 A1 | 12/2004 | Fuii |
| 2005/0140308 A1 | 6/2005 | Park |
| 2005/0237279 A1 | 10/2005 | Chen |
| 2006/0022907 A1 | 2/2006 | Uchino |
| 2006/0027819 A1 | 2/2006 | Hu |

FOREIGN PATENT DOCUMENTS

| | | |
|---|---|---|
| CN | 1551692 A | 12/2004 |
| CN | 1638569 A | 7/2005 |
| CN | 1765156 A | 4/2006 |
| TW | 556135 | 10/2003 |
| TW | I277366 | 3/2007 |
| TW | I311307 | 6/2009 |

*Primary Examiner* — Ricardo L Osorio
(74) *Attorney, Agent, or Firm* — Winston Hsu; Scott Margo (57) ABSTRACT

A pixel structure of active matrix organic electroluminescent display panel includes a first light emitting device, a first driving switching device electrically connected to the first light emitting device for driving the first light emitting device, a second light emitting device, a second driving switching device electrically connected to the second light emitting device for driving the second light emitting device, and at least one addressing switching device electrically connected to at least one of the first driving switching device and the second driving switching device.

21 Claims, 8 Drawing Sheets

PIXEL STRUCTURE OF ACTIVE MATRIX ORGANIC ELECTROLUMINESCENT DISPLAY PANEL AND METHOD OF MAKING THE SAME

BACKGROUND OF THE INVENTION

1. Field of the Invention

The present invention is related to a pixel structure of active matrix organic electroluminescent display panel and a method of making the pixel structure, and more particularly, to the pixel structure of active matrix organic electroluminescent display panel having switchable function between single-side display mode and double-side display mode, and a method of making the same.

2. Description of the Prior Art

The active matrix organic electroluminescent display panel is generally expected as the mainstream of the next generation display panel because of its low-temperature manufacturing process, feasibility of large-size display, real-time response, low operation voltage, high efficiency, wider viewing angle and auto luminescence.

In current active matrix organic electroluminescent display panel, both single-side display mode active matrix organic electroluminescent display panel and double-side display mode active matrix organic electroluminescent display panel exist. However, the conventional active matrix organic electroluminescent display panel is not able to be switched between single-side display mode and double-side display mode, for this reason, the applications of active matrix organic electroluminescent display panel is restricted dramatically.

SUMMARY OF THE INVENTION

It is therefore one of the objectives of the present invention to provide a pixel structure of active matrix organic electroluminescent display panel and a method of making the same to enable switchable display modes, in other words, to enable the function of switching the display mode alternatively between single-side display mode and double-side display mode.

An exemplary embodiment of a pixel structure of active matrix organic electroluminescent display panel of the present invention includes a transparent substrate, a first driving switching device, a first light emitting device, a second driving switching device and a second light emitting device. The transparent substrate includes a pixel region, and the pixel region includes a first region and a second region. The first driving switching device is disposed on the transparent substrate and in the first region. The first light emitting device is disposed on the transparent substrate and in the first region, and the first light emitting device includes a first transparent anode electrically connected to the first driving switching device, a first transparent cathode disposed above the first transparent anode and a first organic electroluminescent layer disposed between the first transparent anode and the first transparent cathode. The second driving switching device is disposed on the transparent substrate and in the second region. The second light emitting device is disposed on the transparent substrate and in the second region, and the second light emitting device includes a second transparent anode electrically connected to the second driving switching device, a second cathode disposed above the second transparent anode in which the second cathode and the first transparent cathode are electrically connected to each other and a second organic electroluminescent layer disposed between the second transparent anode and the second cathode.

Another exemplary embodiment of a pixel structure of active matrix organic electroluminescent display panel of the present invention includes a first light emitting device, a first driving switching device electrically connected to the first light emitting device for driving the first light emitting device, a second light emitting device, a second driving switching device electrically connected to the second light emitting device for driving the second light emitting device and at least one addressing switching device electrically connected to at least one of the first light emitting device and the second light emitting device.

Still another exemplary embodiment of a method of forming a pixel structure of active matrix organic electroluminescent display panel of the present invention includes the following steps. A transparent substrate is provided, a pixel region is defined on the transparent substrate, and the pixel region includes a first region and a second region. A first driving switching device is formed in the first region of the transparent substrate, a second driving switching device is formed in the second region of the transparent substrate, a first light emitting device is formed in the first region of the transparent substrate and a second light emitting device is formed in the second region of the transparent substrate. The first light emitting device includes a first transparent anode electrically connected to the first driving switching device, a first transparent cathode disposed above the first transparent anode and a first organic electroluminescent layer disposed between the first transparent anode and the first transparent cathode. The second driving switching device includes a second transparent anode electrically connected to the second driving switching device, a second cathode disposed above the second transparent anode and a second organic electroluminescent layer disposed between the second transparent anode and the second cathode, and in which the second cathode and the first transparent cathode are electrically connected to each other.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be made in detail. The preferred embodiments of the present invention are illustrated in the accompanying drawings with numbered elements.

Figure 1:
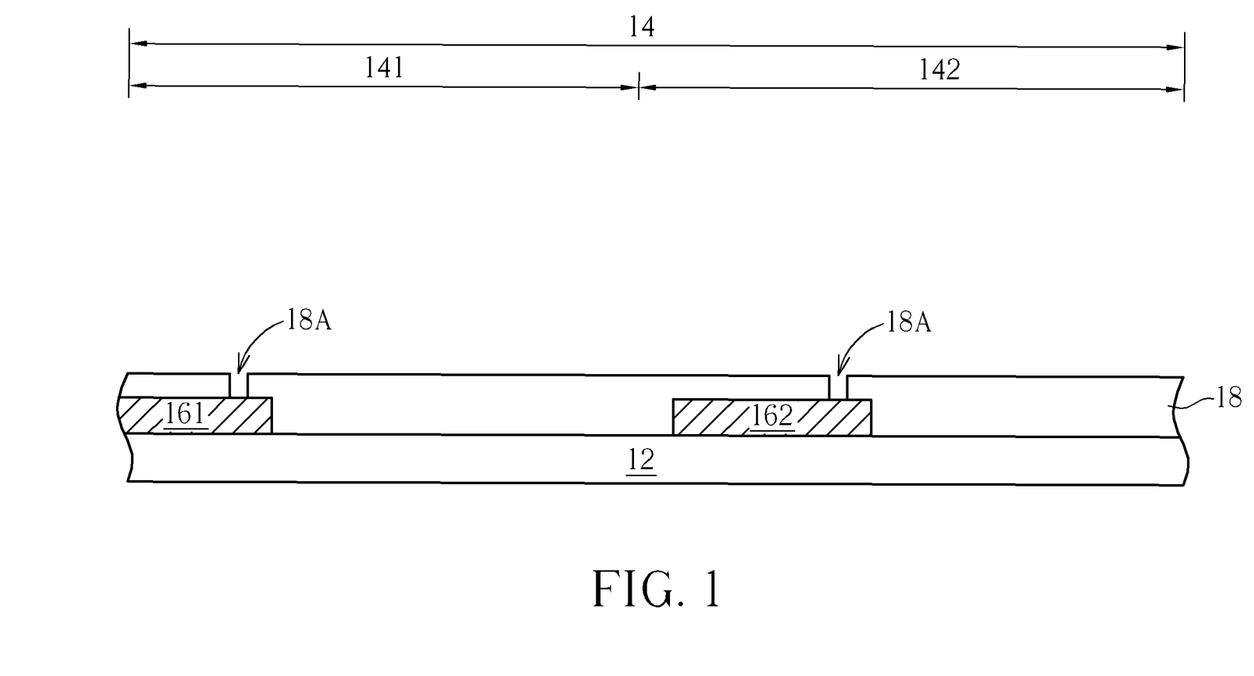
FIG. 1 and FIG. 2 are schematic diagrams illustrating a manufacturing method of a pixel structure of active matrix organic electroluminescent display panel according to a first exemplary embodiment of the present invention.
Figure 2:
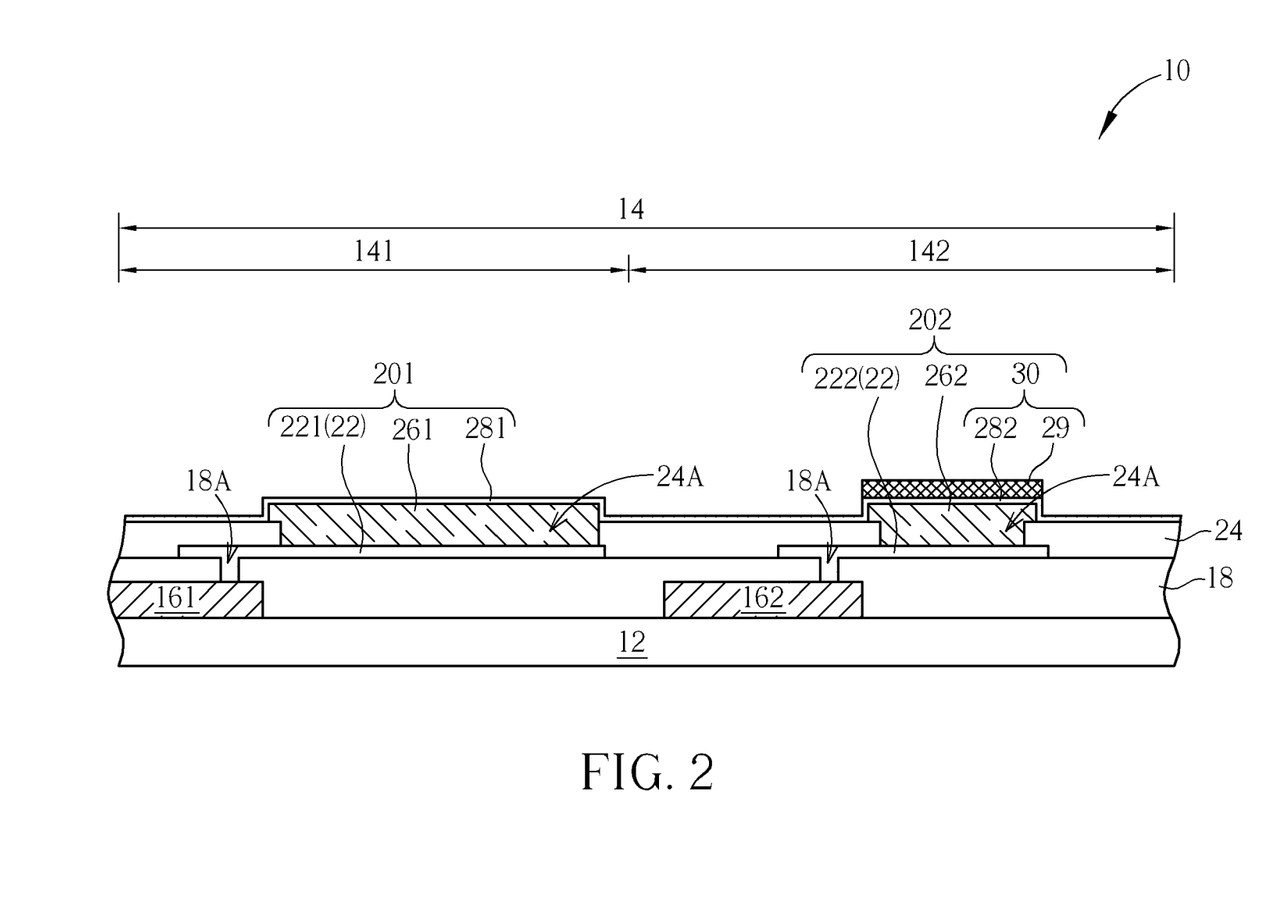

Please refer to FIG. 1 and FIG. 2. FIG. 1 and FIG. 2 are schematic diagrams illustrating a manufacturing method of a pixel structure of active matrix organic electroluminescent display panel according to a first exemplary embodiment of the present invention. As shown in FIG. 1, at first, a transparent substrate 12 is provided, and the transparent substrate 12 may include a glass substrate, a quartz substrate or a plastic substrate, but not limited thereto. A pixel region 14 is defined on the transparent substrate 12, and the pixel region 14 includes a first region 141 and a second region 142. The first region 141 is used to dispose first driving switching device and first light emitting device, and the second region 142 is used to dispose second driving switching device and second light emitting device. Subsequently, a first driving switching device 161 is formed in the first region 141 of the pixel region 14 on the transparent substrate 12, and a second driving switching device 162 is formed in the second region 142 of the pixel region 14 on the transparent substrate 12. In this exemplary embodiment, the first driving switching device 161 and the second driving switching device 162 are implemented by thin-film transistors (TFTs), but not limited thereto. Afterward, a first protective layer 18 is formed on the transparent substrate 12, and the first protective layer 18 covers the first driving switching device 161 and the second driving switching device 162. The first protective layer 18 could be organic material or inorganic material, and the first protective layer 18 could be a single-layered structure or a multi-layered structure. Furthermore, a plurality of contact holes 18A is formed in the first protective layer 18. Each of the contact holes 18A exposes a part of the first driving switching device 161 or a part of the second driving switching device 162 for further electrical connections between the first driving switching device 161 and a first light emitting device to be formed and between the second driving switching device 162 and a second light emitting device to be formed.

As shown in FIG. 2, a first light emitting device 201 is formed in the first region 141 of the pixel region 14 on the transparent substrate 12, and a second light emitting device 202 is formed in the second region 142 of the pixel region 14 on the transparent substrate 12. The first light emitting device 201 and the second light emitting device 202 may be organic electroluminescent devices such as organic light emitting diodes (OLEDs), but not limited thereto. The manufacturing steps of the first light emitting device 201 and the second light emitting device 202 according to this exemplary embodiment are detailed as follows. First, a first patterned transparent conductive layer 22 is formed on the first protective layer 18. The first patterned transparent conductive layer 22 includes a first transparent anode 221 and a second transparent anode 222, the first transparent anode 221 is electrically connected to the first driving switching device 161 by means of the contact hole 18A to serve as an anode of the first light emitting device 201, and the second transparent anode 222 is electrically connected to the second driving switching device 162 by means of the contact hole 18A to serve as an anode of the second light emitting device 202, respectively. The first transparent anode 221 and the second transparent anode 222 may be made of any kind of transparent conductive material having good conductivity such as indium tin oxide (ITO), or thinner opaque conductive materials having light transmission characteristic such as metal. Additionally, the first transparent anode 221 and the second transparent anode 222 are defined by the same photo mask and formed simultaneously. Subsequently, a second protective layer 24 is formed on the first protective layer 18 and the first patterned transparent conductive layer 22. The second protective layer 24 could be made of organic material or inorganic material, and the second protective layer 24 could be a single-layered structure or a multi-layered structure. Subsequently, a plurality of contact holes 24A are formed in the second protective layer 24. Each of the contact holes 24A exposes a part of the first transparent anode 221 or a part of the second transparent anode 222. Then, a first organic electroluminescent layer 261 is formed on the part of the first transparent anode 221 exposed by the contact hole 24A of the second protective layer 24, and a second organic electroluminescent layer 262 is formed on the part of the second transparent anode 222 exposed by the contact hole 24A of the second protective layer 24, respectively. The first organic electroluminescent layer 261 and the second organic electroluminescent layer 262 could be made of any kind of luminous organic material or luminous polymer material. In addition, the first organic electroluminescent layer 261 and the second organic electroluminescent layer 262 could be defined by the same mask such as fine metal mask (FMM) and formed simultaneously. Later, a first transparent cathode 281 is formed on the first organic electroluminescent layer 261, a second cathode 30 is formed on the second organic electroluminescent layer 262, and the second cathode 30 and the first transparent cathode 281 are electrically connected to each other. The first transparent cathode 281 may be made of any kind of transparent conductive materials having good conductivity such as indium tin oxide (ITO), or thinner opaque conductive materials having light transmission characteristic such as metal. In this exemplary embodiment, the second cathode 30 includes a second transparent cathode 282 and a reflection electrode 29 stacked on each other, and the second transparent cathode 282 may be made of the same material as that of the first transparent cathode 281. The first transparent cathode 281 and the second transparent cathode 282 could be defined by the same photo mask and formed simultaneously to be a planar and continuous transparent conductive layer, in other words, the first transparent cathode 281 and the second transparent cathode 282 could serve as a common cathode, but not limited thereto. The reflection electrode 29 may be made of any kind of material having good refractive index such as metal. After the formation of the second transparent cathode 282, the reflection electrode 29 is formed on the second transparent cathode 282 and electrically connected to the second transparent cathode 282. Accordingly, the pixel structure 10 of active matrix organic electroluminescent display panel according to the first exemplary embodiment is fabricated.

The pixel structure of active matrix organic electroluminescent display panel and the method of making the same pixel structure are not limited to the first exemplary embodiment. The following paragraphs will detail the pixel structure of active matrix organic electroluminescent display panel and the method of making the same pixel structure according to the other exemplary embodiments of the present invention. In the following exemplary embodiments, the same components are denoted by the same numerals, and only the differences are discussed while the similarities are omitted.

Figure 3:
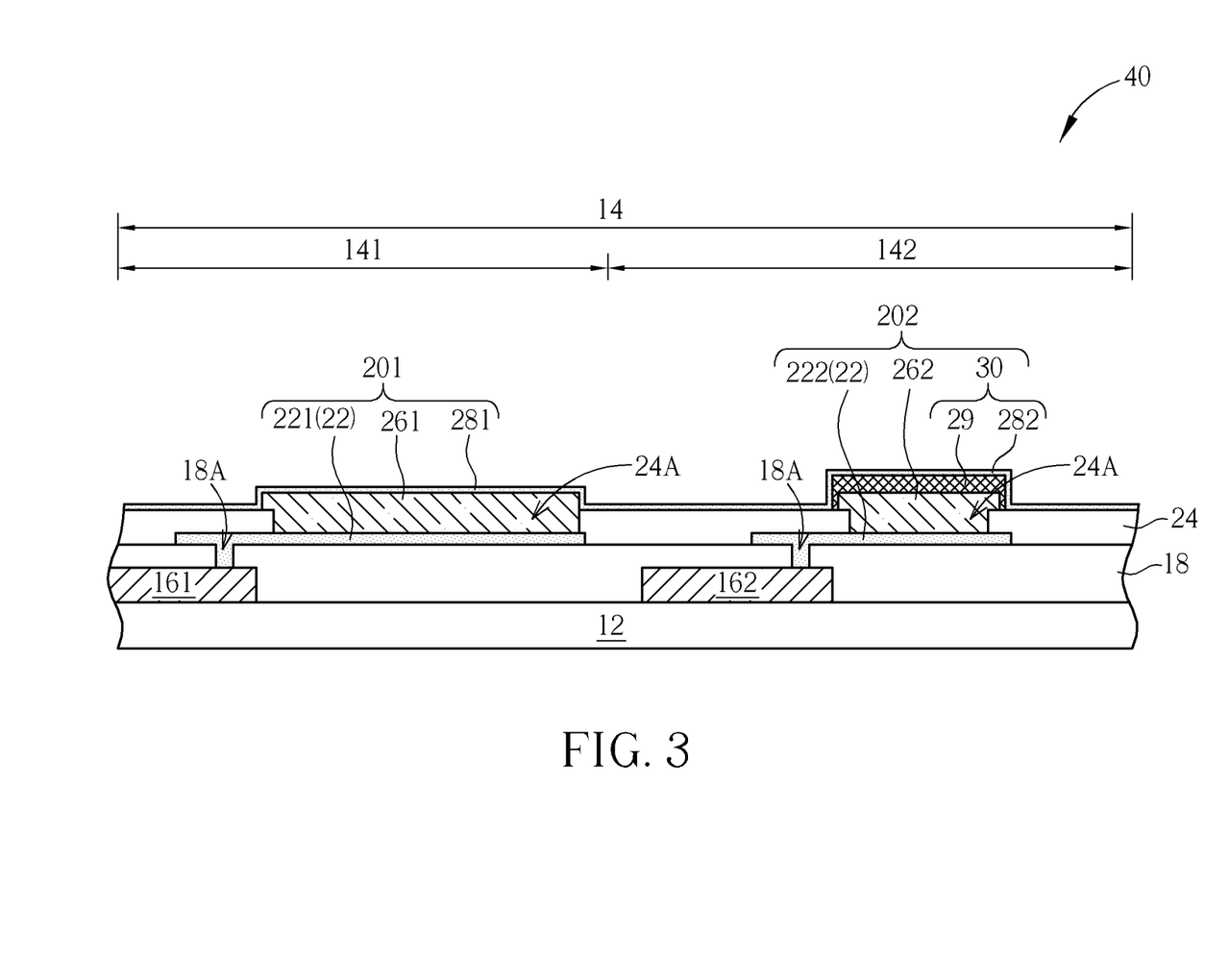
FIG. 3 is a schematic diagram illustrating a pixel structure of active matrix organic electroluminescent display panel according to a second exemplary embodiment of the present invention.

Please refer to FIG. 3, and refer to FIG. 1 together. FIG. 3 is a schematic diagram illustrating a pixel structure of active matrix organic electroluminescent display panel according to a second exemplary embodiment of the present invention. As shown in FIG. 3, in this exemplary embodiment, the second cathode 30 also includes the second transparent cathode 282 and the reflection electrode 29, however, the reflection electrode 29 is formed before the formation of the second transparent cathode 282. Accordingly, the pixel structure 40 of active matrix organic electroluminescent display panel according to the second exemplary embodiment is fabricated.

In the present invention, the first transparent anode and first transparent cathode of the first light emitting device are transparent electrodes, and the first light emitting device could be a double-side light emitting device. The second cathode of the second light emitting device includes the reflection electrode, and the second light emitting device could be a single-side light emitting device. The pixel structure of active matrix organic electroluminescent display panel further includes at least one addressing switching device, and the addressing switching device may be electrically connected to the first driving switching device, or the second driving switching device, or both of them to enable the function of switching the display mode alternatively between single-side display mode and double-side display mode. The following paragraphs will detail the switching mechanism of display modes according to the present invention.

Figure 4:
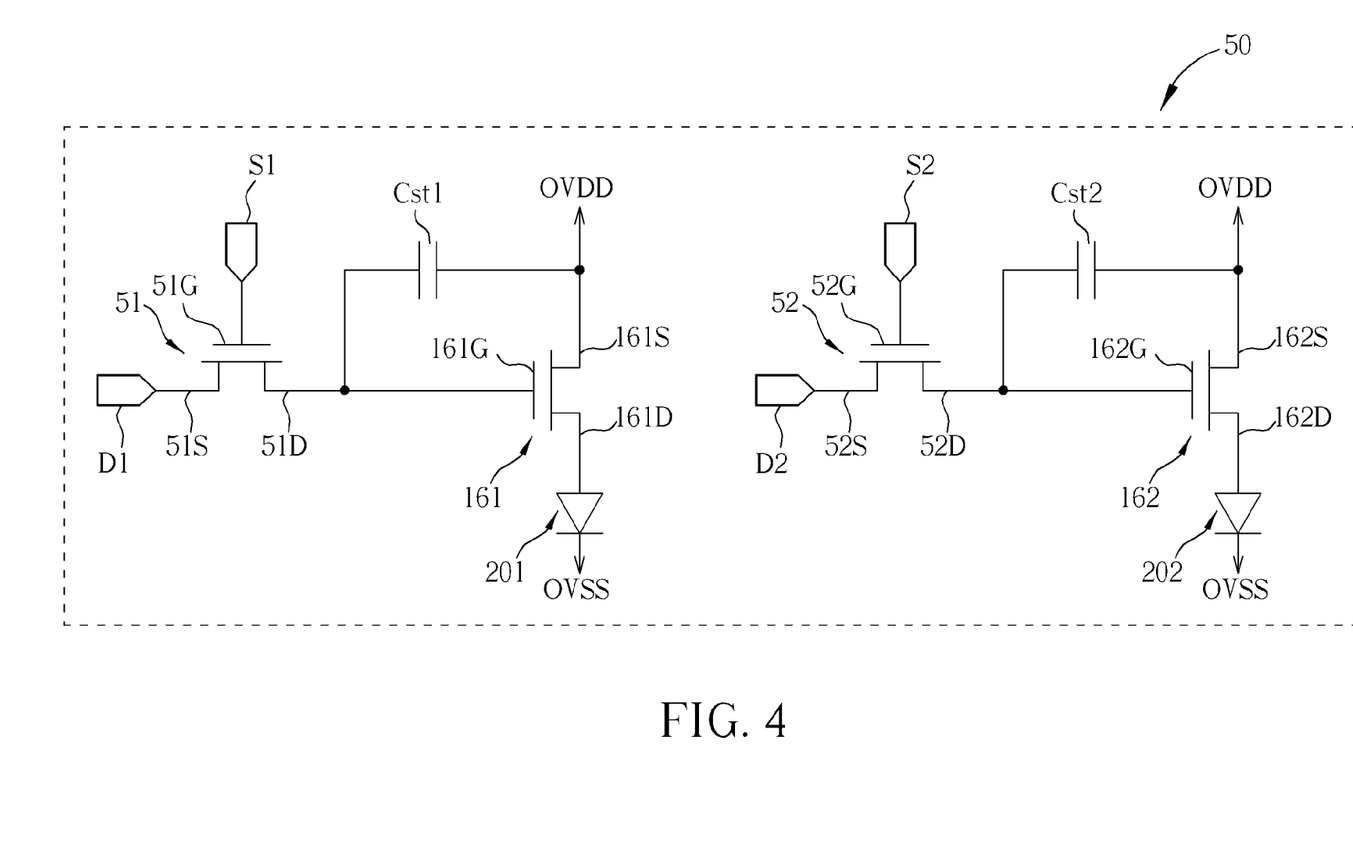
FIG. 4 is a circuit schematic diagram of a pixel structure of active matrix organic electroluminescent display panel according to a third exemplary embodiment of the present invention.

Please refer to FIG. 4, and refer to FIG. 2 and FIG. 3 together. FIG. 4 is a circuit schematic diagram of a pixel structure of active matrix organic electroluminescent display panel according to a third exemplary embodiment of the present invention. As shown in FIG. 4, in this exemplary embodiment, the pixel structure 50 of active matrix organic electroluminescent display panel includes a first driving switching device 161, a second driving switching device 162, a first light emitting device 201, a second light emitting device 202, a first storage capacitor Cst1, a second storage capacitor Cst2, a first addressing switching device 51, a second addressing switching device 52, a voltage source OVDD and a voltage source OVSS. A drain 51D of the first addressing switching device 51 is electrically connected to a gate 161G of the first driving switching device 161 for switching the first driving switching device 161, a gate 51G of the first addressing switching device 51 could be turned on after receiving a scan-line signal S1, and a source 51S of the first addressing switching device 51 is electrically connected to a data-line signal D1. The first light emitting device 201 is electrically connected to a drain 161D of the first driving switching device 161 and the voltage source OVSS, respectively. A drain 52D of the second addressing switching device 52 is electrically connected to a gate 162G of the second driving switching device 162 for switching the second driving switching device 162, a gate 52G of the second addressing switching device 52 could be turned on after receiving another scan-line signal S2, and a source 52S of the second addressing switching device 52 is electrically connected to another data-line signal D2. The second light emitting device 202 is electrically connected to a drain 162D of the second driving switching device 162 and the voltage source OVSS, respectively. The voltage source OVDD is electrically connected to a source 161S of the first driving switching device 161 and a source 162S of the second driving switching device 162. Accordingly, the first addressing switching device 51 could control the status (turn on/turn off) of the first driving switching device 161 respectively for the further control of the first light emitting device 201, and the second addressing switching device 52 could control the status (turn on/turn off) of the second driving switching device 162 respectively for the further control of the second light emitting device 202. Consequently, by means of the first addressing switching device 51 and the second addressing switching device 52, the active matrix organic electroluminescent display panel having the pixel structure 50 could have the function of switching the display mode alternatively between single-side display and double-side display. For instance, when the first light emitting device 201 is a double-side light emitting device and the second light emitting device 202 is a single-side light emitting device, the double-side display mode could be validated by turning on the first addressing switching device 51 and the second addressing switching device 52 simultaneously or by only turning on the first addressing switching device 51, while the single-side display mode could be validated by only turning on the second addressing switching device 52.

Figure 5:
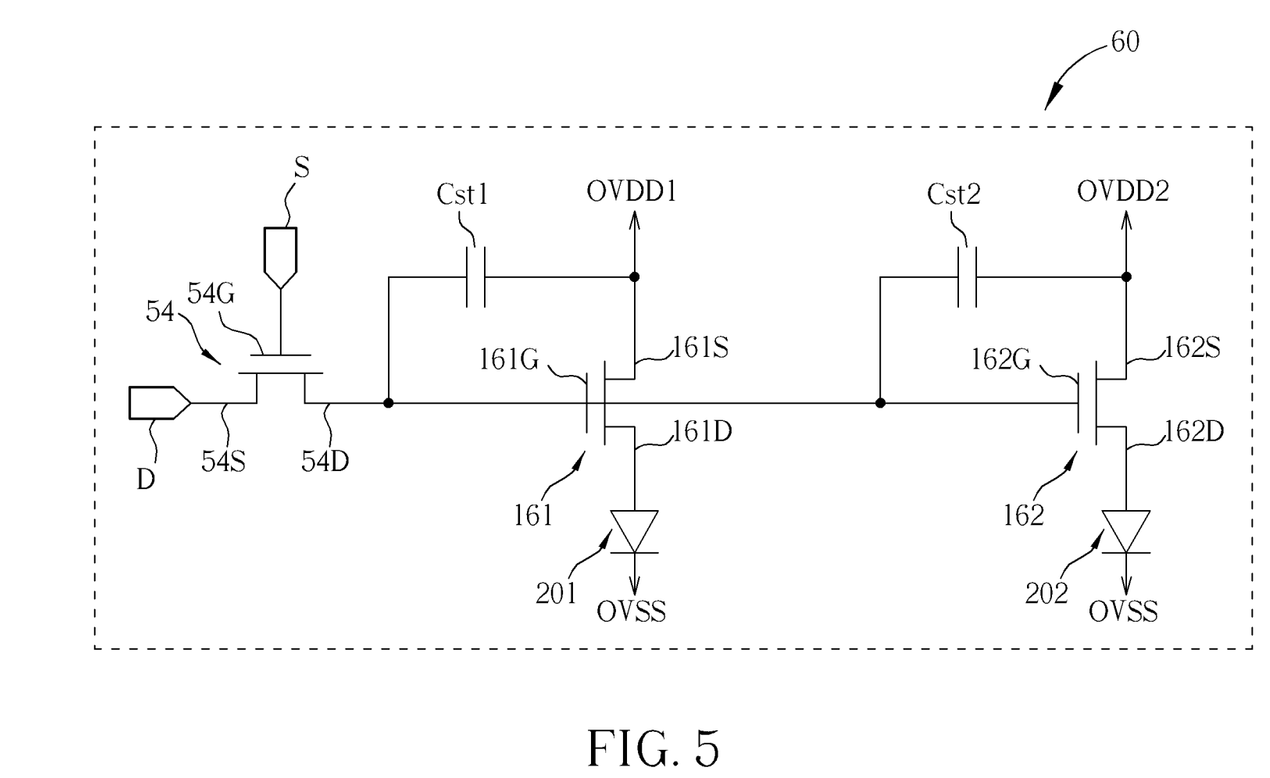
FIG. 5 is a circuit schematic diagram of a pixel structure of active matrix organic electroluminescent display panel according to a fourth exemplary embodiment of the present invention.

Please refer to FIG. 5, and refer to FIG. 2 and FIG. 3 together. FIG. 5 is a circuit schematic diagram of a pixel structure of active matrix organic electroluminescent display panel according to a fourth exemplary embodiment of the present invention. As shown in FIG. 5, in this exemplary embodiment, the pixel structure 60 of active matrix organic electroluminescent display panel includes a first driving switching device 161, a second driving switching device 162, a first light emitting device 201, a second light emitting device 202, a first storage capacitor Cst1, a second storage capacitor Cst2, an addressing switching device 54, a first voltage source OVDD1, a second voltage source OVDD2 and a voltage source OVSS. A drain 54D of the addressing switching device 54 is electrically connected to a gate 161G of the first driving switching device 161 for switching the first driving switching device 161 and to a gate 162G of the second driving switching device 162 for switching the second driving switching device 162, a gate 54G of the addressing switching device 54 could be turned on after receiving a scan-line signal S, and a source 54S of the addressing switching device 54 is electrically connected to a data-line signal D. The first light emitting device 201 is electrically connected to a drain 161D of the first driving switching device 161 and the voltage source OVSS, respectively. The second light emitting device 202 is electrically connected to a drain 162D of the second driving switching device 162 and the voltage source OVSS, respectively. The first voltage source OVDD1 is electrically connected to a source 161S of the first driving switching device 161, and the second voltage source OVDD2 is electrically connected to a source 162S of the second driving switching device 162. Accordingly, the addressing switching device 54 could control the status (turn on/turn off) of the first driving switching device 161 and the second driving switching device 162 simultaneously, and the disposition of the addressing switching device 54 in company with the first voltage source OVDD1 and the second voltage source OVDD2 able to be controlled independently make the active matrix organic electroluminescent display panel having the pixel structure 60 possess the function of switching the display mode alternatively between single-side display and double-side display. For instance, when the first light emitting device 201 is a double-side light emitting device and the second light emitting device 202 is a single-side light emitting device, the double-side display mode could be validated by turning on the addressing switching device 54 and only supplying the first voltage source OVDD1, or supplying both of the first voltage source OVDD1 and the second voltage source OVDD2, while the single-side display mode could be validated by turning on the addressing switching device 54 and only supplying the first voltage source OVDD1.

Figure 6:
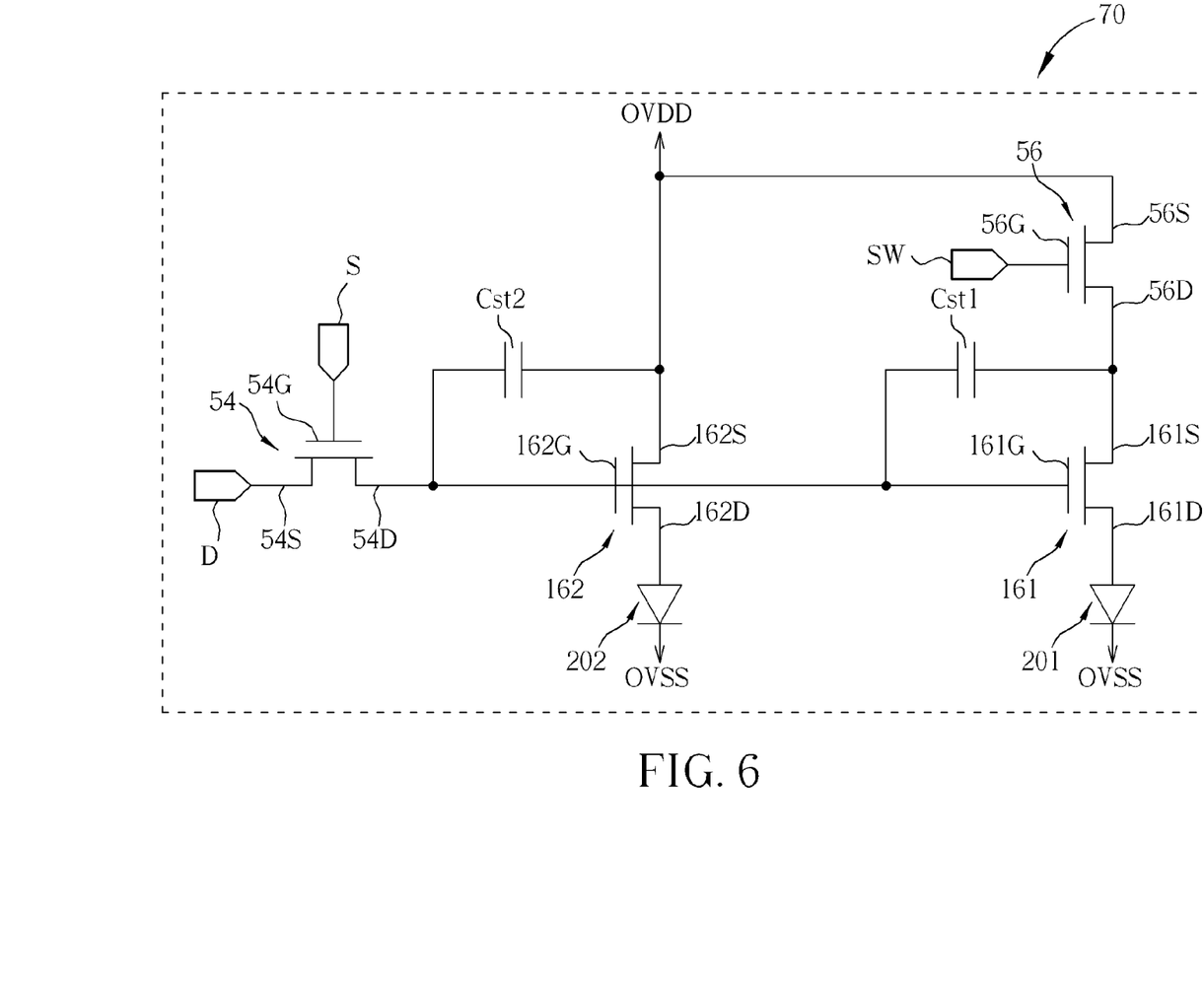
FIG. 6 is a circuit schematic diagram of a pixel structure of active matrix organic electroluminescent display panel according to a fifth exemplary embodiment of the present invention.

Please refer to FIG. 6, and refer to FIG. 2 and FIG. 3 together. FIG. 6 is a circuit schematic diagram of a pixel structure of active matrix organic electroluminescent display panel according to a fifth exemplary embodiment of the present invention. As shown in FIG. 6, in this exemplary embodiment, the pixel structure 70 of active matrix organic electroluminescent display panel includes a first driving switching device 161, a second driving switching device 162, a first light emitting device 201, a second light emitting device 202, a first storage capacitor Cst1, a second storage capacitor Cst2, an addressing switching device 54, a selecting switching device 56, a voltage source OVDD and a voltage source OVSS. A drain 54D of the addressing switching device 54 is electrically connected to a gate 161G of the first driving switching device 161 for switching the first driving switching device 161 and to a gate 162G of the second driving switching device 162 for switching the second driving switching device 162. A gate 54G of the addressing switching device 54 could be turned on after receiving a scan-line signal S, and a source 54S of the addressing switching device 54 is electrically connected to a data-line signal D. The voltage source OVDD is electrically connected to a source 162S of the second driving switching device 162 and to a source 56S of the selecting switching device 56, a drain 56D of the selecting switching device 56 is electrically connected to a source 161S of the first driving switching device 161, and a gate 56G of the selecting switching device 56 could be turned on after receiving a selecting signal SW. The first light emitting device 201 is electrically connected to a drain 161D of the first driving switching device 161 and the voltage source OVSS, respectively. The second light emitting device 202 is electrically connected to a drain 162D of the second driving switching device 162 and the voltage source OVSS, respectively. Accordingly, the addressing switching device 54 could control the status (turn on/turn off) of the first driving switching device 161 and the second driving switching device 162 simultaneously, and the selecting switching device 56 could control the electrical connection between the first driving switching device 161 and the voltage source OVDD to make the active matrix organic electroluminescent display panel having the pixel structure 70 possess the function of switching the display mode alternatively between single-side display mode and double-side display mode. For instance, when the first light emitting device 201 is a double-side light emitting device and the second light emitting device 202 is a single-side light emitting device, the double-side display could be validated by turning on both of the addressing switching device 54 and the selecting switching device 56, while the single-side display could be validated by only turning on the addressing switching device 54 and turning off the selecting switching device 56.

Figure 7:
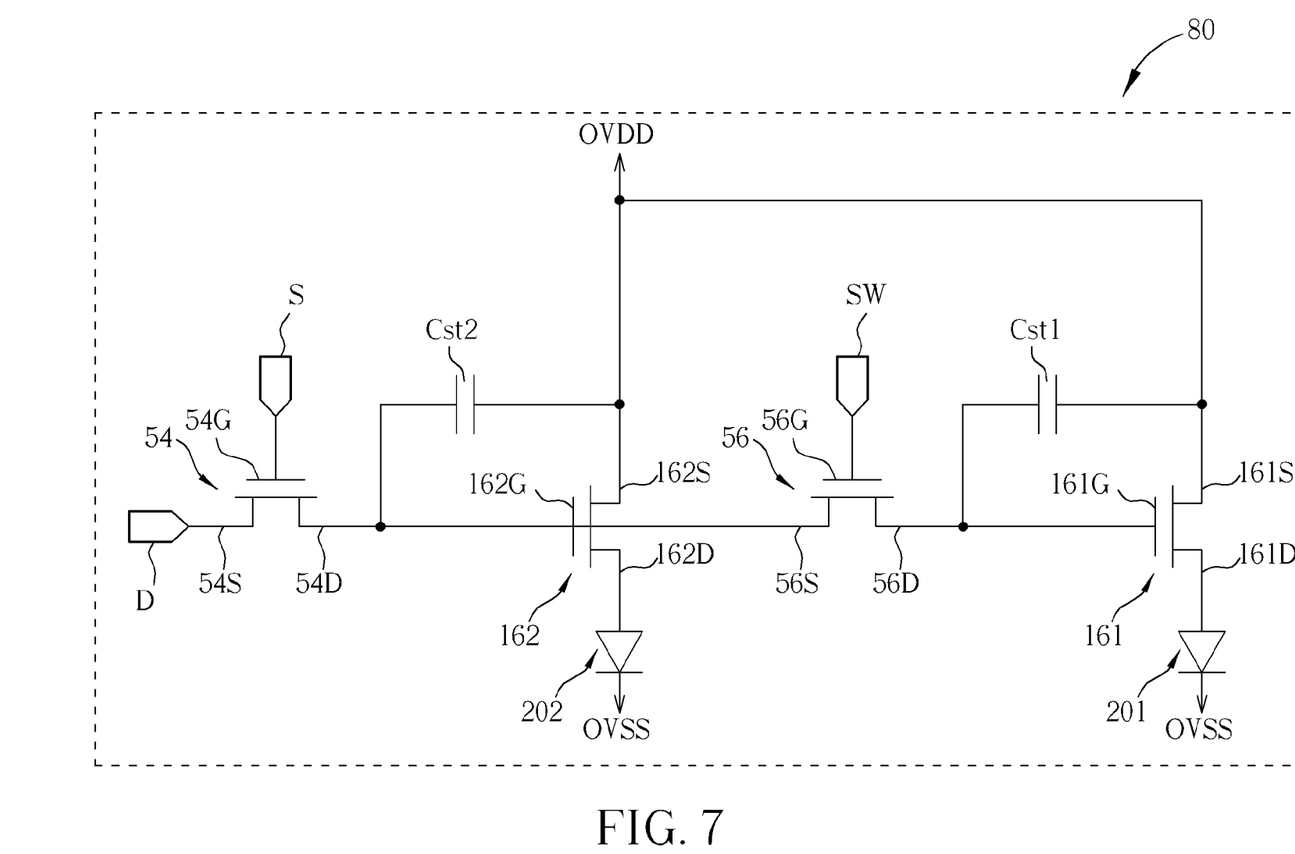
FIG. 7 is a circuit schematic diagram of a pixel structure of active matrix organic electroluminescent display panel according to a sixth exemplary embodiment of the present invention.

Please refer to FIG. 7, and refer to FIG. 2 and FIG. 3 together. FIG. 7 is a circuit schematic diagram of a pixel structure of active matrix organic electroluminescent display panel according to a sixth exemplary embodiment of the present invention. As shown in FIG. 7, in this exemplary embodiment, the pixel structure 80 of active matrix organic electroluminescent display panel includes a first driving switching device 161, a second driving switching device 162, a first light emitting device 201, a second light emitting device 202, a first storage capacitor Cst1, a second storage capacitor Cst2, an addressing switching device 54, a selecting switching device 56, a voltage source OVDD and a voltage source OVSS. A drain 54D of the addressing switching device 54 is electrically connected to a gate 162G of the second driving switching device 162 and to a source 56S of the selecting switching device 56. A gate 54G of the addressing switching device 54 could be turned on after receiving a scan-line signal S, and a source 54S of the addressing switching device 54 is electrically connected to a data-line signal D. The voltage source OVDD is electrically connected to a source 161S of the first driving switching device 161 and to a source 162S of the second driving switching device 162. A drain 56D of the selecting switching device 56 is electrically connected to a gate 161G of the first driving switching device 161, and a gate 56G of the selecting switching device 56 could be turned on after receiving a selecting signal SW. The first light emitting device 201 is electrically connected to a drain 161D of the first driving switching device 161 and the voltage source OVSS, respectively. The second light emitting device 202 is electrically connected to a drain 162D of the second driving switching device 162 and the voltage source OVSS, respectively. Accordingly, the addressing switching device 54 could control the status (turn on/turn off) of the second driving switching device 162. When the selecting switching device 56 turns on, the addressing switching device 54 could control the status (turn on/turn off) of the first driving switching device 161 and the second driving switching device 162 simultaneously; when the selecting switching device 56 turns off, the first driving switching device 161 turns off as well. With this deposition, the function of switching the display mode alternatively between single-side display mode and double-side display mode is enabled for the active matrix organic electroluminescent display panel having the pixel structure 80. For instance, when the first light emitting device 201 is a double-side light emitting device and the second light emitting device 202 is a single-side light emitting device, the double-side display mode could be validated by turning on both of the addressing switching device 54 and the selecting switching device 56, while the single-side display mode could be validated by only turning on the addressing switching device 54 and turning off the selecting switching device 56.

Figure 8:
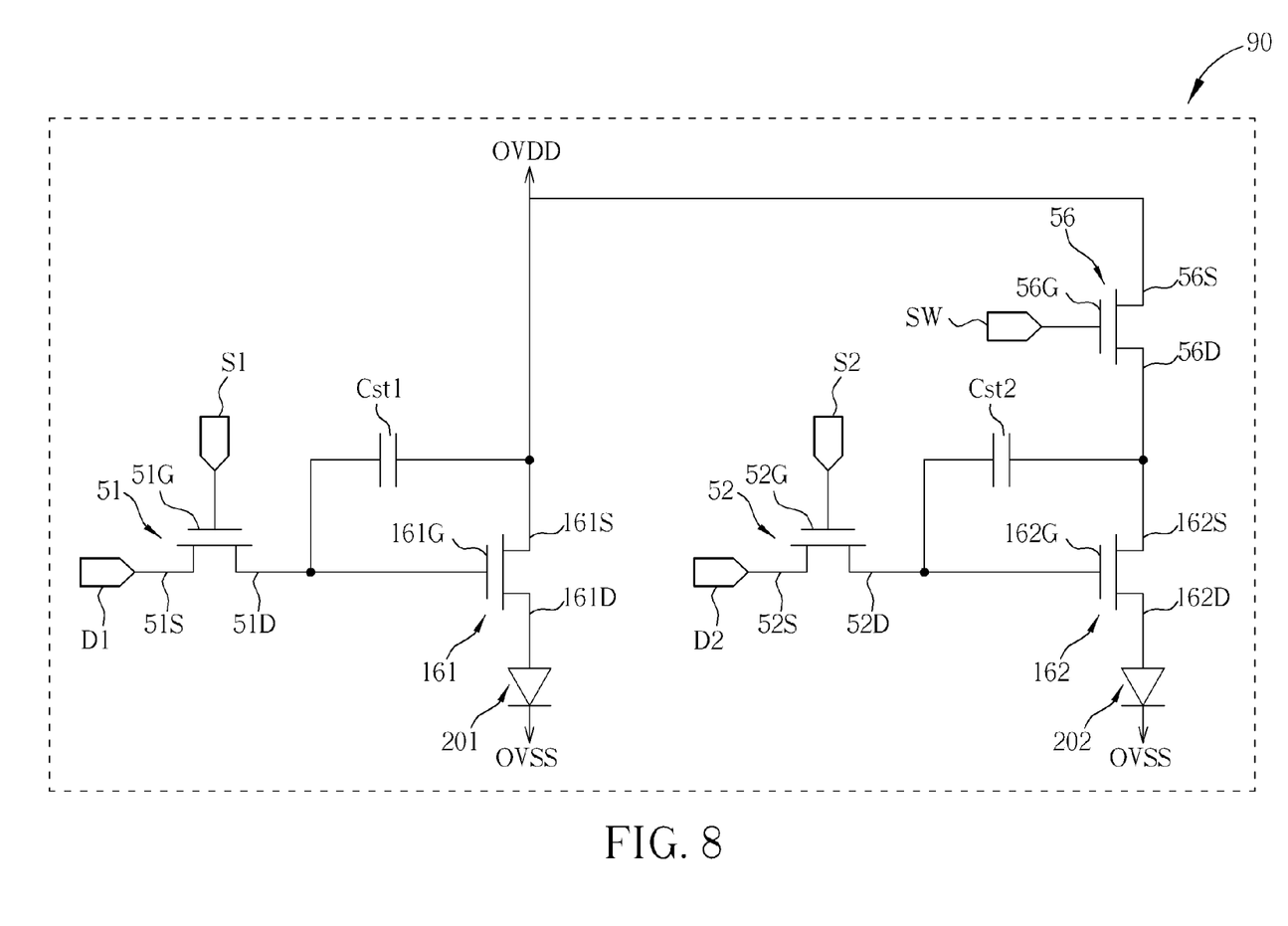
FIG. 8 is a circuit schematic diagram of a pixel structure of active matrix organic electroluminescent display panel according to a seventh exemplary embodiment of the present invention.

Please refer to FIG. 8, and refer to FIG. 2 and FIG. 3 together. FIG. 8 is a circuit schematic diagram of a pixel structure of active matrix organic electroluminescent display panel according to a seventh exemplary embodiment of the present invention. As shown in FIG. 8, in this exemplary embodiment, the pixel structure 90 of active matrix organic electroluminescent display panel includes a first driving switching device 161, a second driving switching device 162, a first light emitting device 201, a second light emitting device 202, a first storage capacitor Cst1, a second storage capacitor Cst2, a first addressing switching device 51, a second addressing switching device 52, a selecting switching device 56, a voltage source OVDD and a voltage source OVSS. A drain 51D of the first addressing switching device 51 is electrically connected to a gate 161G of the first driving switching device 161 for switching the first driving switching device 161, a gate 51G of the first addressing switching device 51 could be turned on after receiving a scan-line signal S1, and a source 51S of the first addressing switching device 51 is electrically connected to a data-line signal D1. The first light emitting device 201 is electrically connected to a drain 161D of the first driving switching device 161 and the voltage source OVSS, respectively. A drain 52D of the second addressing switching device 52 is electrically connected to a gate 162G of the second driving switching device 162 for switching the second driving switching device 162. A gate 52G of the second addressing switching device 52 could be turned on after receiving another scan-line signal S2, and a source 52S of the second addressing switching device 52 is electrically connected to another data-line signal D2. The second light emitting device 202 is electrically connected to a drain 162D of the second driving switching device 162 and the voltage source OVSS, respectively. The voltage source OVDD is electrically connected to a source 161S of the first driving switching device 161 and to a source 56S of the selecting switching device 56, a drain 56D of the selecting switching device 56 is electrically connected to a source 162S of the second driving switching device 162, and a gate 56G of the selecting switching device 56 could be turned on after receiving a selecting signal SW. Accordingly, the first addressing switching device 51 could control the status (turn on/turn off) of the first driving switching device 161 independently for the further control of the first light emitting device 201. The second addressing switching device 52 could control the status (turn on/turn off) of the second driving switching device 162, and when the selecting switching device 56 turns on, the second light emitting device 202 could be electrically connected the voltage source OVDD. Consequently, by means of the first addressing switching device 51, the second addressing switching device 52 and the selecting switching device 56, the active matrix organic electroluminescent display panel having the pixel structure 90 could have the function of switching the display mode alternatively between single-side display mode and double-side display mode. For instance, when the first light emitting device 201 is a double-side light emitting device and the second light emitting device 202 is a single-side light emitting device, the double-side display could be validated by turning on the first addressing switching device 51, the second addressing switching device 52 and the selecting switching device 56 simultaneously, or by only turning on the first addressing switching 51. The single-side display could be validated by only turning on the second addressing switching device 52 and the selecting switching device 56.

In conclusion, the manufacturing method of the present invention provides the pixel structure of active matrix organic electroluminescent display panel without additional photo mask, and the pixel structure includes the single-side light emitting device and the double-side light emitting device. Additionally, by means of the addressing switching device and the selecting switching device, the pixel structure of active matrix organic electroluminescent display panel enables the function of switching the display mode alternatively between single-side display mode and double-side display mode, and the applications of active matrix organic electroluminescent display panel are extended greatly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pixel structure of active matrix organic electroluminescent display panel, comprising:
a transparent substrate, the transparent substrate comprising a pixel region, wherein the pixel region comprises a first region and a second region;
a first driving switching device disposed on the transparent substrate, wherein the first driving switching device is disposed in the first region;
a first light emitting device disposed on the transparent substrate, wherein the first light emitting device is disposed in the first region, and the first light emitting device comprises:
a first transparent anode electrically connected to the first driving switching device;
a first transparent cathode disposed above the first transparent anode; and
a first organic electroluminescent layer disposed between the first transparent anode and the first transparent cathode;
a second driving switching device disposed on the transparent substrate, wherein the second driving switching device is disposed in the second region; and
a second light emitting device disposed on the transparent substrate, wherein the second light emitting device is disposed in the second region, and the second light emitting device comprises:
a second transparent anode electrically connected to the second driving switching device;
a second cathode disposed above the second transparent anode, wherein the second cathode and the first transparent cathode are electrically connected to each other; and
a second organic electroluminescent layer disposed between the second transparent anode and the second cathode.

2. The pixel structure of active matrix organic electroluminescent display panel of claim 1, wherein the second cathode comprises a second transparent cathode and a reflection electrode stacked on each other.

3. The pixel structure of active matrix organic electroluminescent display panel of claim 2, wherein the reflection electrode of the second cathode is disposed on the second transparent cathode of the second cathode.

4. The pixel structure of active matrix organic electroluminescent display panel of claim 2, wherein the reflection electrode of the second cathode is disposed between the second transparent cathode of the second cathode and the second organic electroluminescent layer.

5. The pixel structure of active matrix organic electroluminescent display panel of claim 1, further comprising a first addressing switching device, a second addressing switching device, and a voltage source, wherein a drain of the first addressing switching device is electrically connected to a gate of the first driving switching device for switching the first driving switching device, a drain of the second addressing switching device is electrically connected to a gate of the second driving switching device for switching the second driving switching device, and the voltage source is electrically connected to a source of the first driving switching device and a source of the second driving switching device, respectively.

6. The pixel structure of active matrix organic electroluminescent display panel of claim 1, further comprising an addressing switching device, a first voltage source and a second voltage source, wherein a drain of the addressing switching device is electrically connected to a gate of the first driving switching device and a gate of the second driving switching device for switching the first driving switching device and the second driving switching device, the first voltage source is electrically connected to a source of the first driving switching device, and the second voltage source is electrically connected to a source of the second driving switching device.

7. The pixel structure of active matrix organic electroluminescent display panel of claim 1, further comprising an addressing switching device, a selecting switching device and a voltage source, wherein a drain of the addressing switching device is electrically connected to a gate of the first driving switching device and a gate of the second driving switching device, the voltage source is electrically connected to a source of the second driving switching device and a source of the selecting switching device, and a drain of the selecting switching device is electrically connected to a source of the first driving switching device.

8. The pixel structure of active matrix organic electroluminescent display panel of claim 1, further comprising an addressing switching device, a selecting switching device and a voltage source, wherein a drain of the addressing switching device is electrically connected to a gate of the second driving switching device and a source of the selecting switching device, the voltage source is electrically connected to a source of the first driving switching device and a source of the second driving switching device.

9. The pixel structure of active matrix organic electroluminescent display panel of claim 1, further comprising a first addressing switching device, a second addressing switching device, a selecting switching device and a voltage source, wherein a drain of the first addressing switching device is electrically connected to a gate of the first driving switching device for switching the first driving switching device, a drain of the second addressing switching device is electrically connected to a gate of the second driving switching device for switching the second driving switching device, the voltage source is electrically connected to a source of the first driving switching device and a source of the selecting switching device, and a drain of the selecting switching device is electrically connected to a source of the second driving switching device.

10. A pixel structure of active matrix organic electroluminescent display panel, comprising:
   a first light emitting device;
   a first driving switching device electrically connected to the first light emitting device for driving the first light emitting device;
   a second light emitting device;
   a second driving switching device electrically connected to the second light emitting device for driving the second light emitting device; and
   at least one addressing switching device electrically connected to at least one of the first driving switching device and the second driving switching device.

11. The pixel structure of active matrix organic electroluminescent display panel of claim 10, further comprising a voltage source, wherein the at least one addressing switching device comprises a first addressing switching device and a second addressing switching device, a drain of the first addressing switching device is electrically connected to a gate of the first driving switching device for switching the first driving switching device, a drain of the second addressing switching device is electrically connected to a gate of the second driving switching device for switching the second driving switching device, and the voltage source is electrically connected to a source of the first driving switching device and a source of the second driving switching device, respectively.

12. The pixel structure of active matrix organic electroluminescent display panel of claim 10, further comprising a first voltage source and a second voltage source, wherein a drain of the addressing switching device is electrically connected to a gate of the first driving switching device and a gate of the second driving switching device respectively, the first voltage source is electrically connected to a source of the first driving switching device, and the second voltage source is electrically connected to a source of the second driving switching device.

13. The pixel structure of active matrix organic electroluminescent display panel of claim 10, further comprising a selecting switching device and a voltage source, wherein a drain of the addressing switching device is electrically connected to a gate of the first driving switching device and a gate of the second driving switching device respectively, the voltage source is electrically connected to a source of the second driving switching device and a source of the selecting switching device, and a drain of the selecting switching device is electrically connected to a source of the first driving switching device.

14. The pixel structure of active matrix organic electroluminescent display panel of claim 10, further comprising a selecting switching device and a voltage source, wherein a drain of the addressing switching device is electrically connected to a gate of the second driving switching device and a source of the selecting switching device respectively, the voltage source is electrically connected to a source of the first driving switching device and a source of the second driving switching device, a source of the selecting switching device is electrically connected to a gate of the second driving switching device, and a drain of the selecting switching device is electrically connected to a gate of the first driving switching device.

15. The pixel structure of active matrix organic electroluminescent display panel of claim 10, further comprising a selecting switching device and a voltage source, wherein the at least one addressing switching device comprises a first addressing switching device and a second addressing switching device, a drain of the first addressing switching device is electrically connected to a gate of the first driving switching device for switching the first driving switching device, a drain of the second addressing switching device is electrically connected to a gate of the second driving switching device for switching the second driving switching device, the voltage source is electrically connected to a source of the first driving switching device and a source of the selecting switching device, and a drain of the selecting switching device is electrically connected to a source of the second driving switching device.

16. The pixel structure of active matrix organic electroluminescent display panel of claim 10, wherein the first light emitting device comprises a double-side light emitting device and the second light emitting device comprises a single-side light emitting device.

17. A method of forming a pixel structure of active matrix organic electroluminescent display panel, comprising:
   providing a transparent substrate, and defining a pixel region on the transparent substrate, wherein the pixel region comprises a first region and a second region;
   forming a first driving switching device in the first region of the pixel region on the transparent substrate and a second driving switching device in the second region of the pixel region on the transparent substrate;
   forming a first light emitting device in the first region of the pixel region on the transparent substrate and a second light emitting device in the second region of the pixel region on the transparent substrate, wherein the first light emitting device comprises:
      a first transparent anode electrically connected to the first driving switching device;
      a first transparent cathode disposed above the first transparent anode; and
      a first organic electroluminescent layer disposed between the first transparent anode and the first transparent cathode; and
   the second light emitting device comprises:
      a second transparent anode electrically connected to the second driving switching device;
      a second cathode disposed above the second transparent anode wherein the second cathode and the first transparent cathode are electrically connected; and a second organic electroluminescent layer disposed between the second transparent anode and the second cathode.

18. The method of forming the pixel structure of active matrix organic electroluminescent display panel of claim 17, wherein the second cathode comprises a second transparent cathode and a reflection electrode stacked on each other.

19. The method of forming the pixel structure of active matrix organic electroluminescent display panel of claim 18, wherein steps for forming the first light emitting device in the first region of the pixel region on the transparent substrate and the second light emitting device in the second region of the pixel region on the transparent substrate comprises:

forming the first transparent anode of the first light emitting device and the second transparent anode of the second light emitting device on the transparent substrate simultaneously;

forming the first organic electroluminescent layer on the first transparent anode and the second organic electroluminescent layer on the second transparent anode simultaneously; and forming the first transparent cathode on the first organic electroluminescent layer and the second transparent cathode on the second organic electroluminescent layer simultaneously.

20. The method of forming the pixel structure of active matrix organic electroluminescent display panel of claim 19, wherein the reflection electrode of the second cathode is formed before the second transparent cathode is formed.

21. The method of forming the pixel structure of active matrix organic electroluminescent display panel of claim 19, wherein the reflection electrode of the second cathode is formed after the second transparent cathode is formed.

* * * * *